United States Patent
Aichriedler et al.

(10) Patent No.: US 11,860,201 B2
(45) Date of Patent: Jan. 2, 2024

(54) COMMUNICATION BETWEEN A MICROCONTROLLER AND AT LEAST ONE SENSOR CHIP

(71) Applicant: Infineon Technologies AG, Neubiberg (DE)

(72) Inventors: Leo Aichriedler, Puch (AT); Gerald Wriessnegger, Villach (AT)

(73) Assignee: Infineon Technologies AG, Neubiberg (DE)

( * ) Notice: Subject to any disclaimer, the term of this patent is extended or adjusted under 35 U.S.C. 154(b) by 276 days.

(21) Appl. No.: 16/949,093

(22) Filed: Oct. 13, 2020

(65) Prior Publication Data

US 2021/0123956 A1 Apr. 29, 2021

(30) Foreign Application Priority Data

Oct. 23, 2019 (DE) .......................... 102019128649.2

(51) Int. Cl.
*G01R 19/252* (2006.01)
*G01R 19/25* (2006.01)

(52) U.S. Cl.
CPC ....... *G01R 19/2506* (2013.01); *G01R 19/252* (2013.01)

(58) Field of Classification Search
CPC .. G01R 19/2506; G01R 19/252; G01R 19/25; G01R 19/00; G01R 31/007; G01R 31/343; G01R 15/20; G01R 15/202; G01R 15/205; G01R 33/0023; G01D 21/02; G05B 19/042; G06F 13/385
See application file for complete search history.

(56) References Cited

U.S. PATENT DOCUMENTS

| | | | | |
|---|---|---|---|---|
| 5,936,520 A | * | 8/1999 | Luitje | G08B 26/001 340/505 |
| 6,424,143 B1 | | 7/2002 | Blossfeld et al. | |
| 7,114,388 B1 | * | 10/2006 | French | G01W 1/00 73/170.16 |
| 8,681,817 B2 | | 3/2014 | Anderson et al. | |
| 2003/0210334 A1 | * | 11/2003 | Sarwari | H04N 5/335 348/222.1 |
| 2006/0177098 A1 | * | 8/2006 | Stam | B60Q 1/1423 382/104 |
| 2017/0242709 A1 | * | 8/2017 | Bodner | G06F 13/4226 |

FOREIGN PATENT DOCUMENTS

| | | |
|---|---|---|
| DE | 19713240 A1 | 10/1998 |
| DE | 19824362 A1 | 12/1999 |
| DE | 202013102373 U1 | 9/2014 |
| EP | 3112884 A1 | 1/2017 |
| KR | 19990088563 A | 12/1999 |
| KR | 20060018875 A | 3/2006 |

* cited by examiner

*Primary Examiner* — Mohamed Charioui
(74) *Attorney, Agent, or Firm* — Harrity & Harrity, LLP

(57) ABSTRACT

The present disclosure relates to a sensor system, comprising a microcontroller, at least one sensor chip designed to measure a physical quantity, wherein the microcontroller and the sensor chip are coupled to one another via at least one analog signal interface for conveying analog measurement data between the sensor chip and the microcontroller and via a bidirectional digital signal interface for conveying digital secondary information between the sensor chip and the microcontroller.

19 Claims, 7 Drawing Sheets

COMMUNICATION BETWEEN A MICROCONTROLLER AND AT LEAST ONE SENSOR CHIP

CROSS REFERENCE TO RELATED APPLICATIONS

This application claims priority to German Patent Application No. 102019128649.2 filed on Oct. 23, 2019, the content of which is incorporated by reference herein in its entirety.

TECHNICAL FIELD

The present disclosure relates to apparatuses and methods for communication between a microcontroller and one or more sensor chips.

BACKGROUND

Physical quantities are captured by sensors in numerous industrial applications in order to take the captured quantities as a basis for controlling technical systems (for example vehicles, washing machines, consumer electronics, etc.). To this end, the sensors frequently deliver their measurement signals to microcontrollers or microprocessors, which act as control units. Current sensors, among other things, are used in numerous applications.

Bandwidth and synchronization demands mean that most current sensors available on the market today have an analog interface for current information (measured values). Extended functions such as fast overcurrent detection can be provided via a further interface, which allows fast confirmation of specific conditions, for example when the measured current exceeds a specific threshold value.

Advanced implementations of for example inverters for the automotive industry or robotics require extended diagnosis opportunities for current sensors. An improved diagnosis is required for example as a result of functional safety demands in the automotive sector (torque accuracy of the drive power) or in industry (maximum torque limiting, e.g. for collaborative robots). The increasing significance of the information from a (current) sensor is determined not only by the torque demands. Advanced safety designs used in drive implementations are also dependent on the current sensor signal in order to determine rotor position or slippage for brushless DC motors, and therefore require functionally safe information from the sensor.

Besides (functional) safety demands, predictive maintenance also requires extended sensor information. Known designs use sensor diagnosis data, such as for example temperature, mechanical loading, vibration, etc.

(Current) sensors today having an analog interface to the microcontroller provide no extended diagnosis and control opportunities. Although many parameters are captured within the sensor apparatus or the sensor chip (for example temperature, stress, supply voltage), the information cannot be retrieved from the microcontroller and is therefore used only inside the sensor chip, for example for compensation purposes.

Conventional sensor chips provide no downstream communication opportunity, and configuration or calibration information needed from the sensor chip therefore has to be stored in the OTP (one-time programming) or nonvolatile memory of the sensor chip. This requires a special customer programming process. In particular in cases in which the sensor data are obtained after the final assembly of a current measurement structure (for example inverter assembly), the programming step can be very cost-intensive. The end-of-line programming not only requires additional work effort but also creates a considerable cost factor, since programming pins of the sensor need to be accessible at inverter level (external connection).

Dynamic (on-the-fly) adaptation of the sensor parameters is not possible. As an example, the gain of the sensor needs to be set such that the analog output signal at the full-value input signal of the sensor remains within an ADC input range. In the event of foreseeable small input signals (for example low currents during low loading), the system therefore suffers from a small ADC input signal swing, which can lead to a poor signal-to-noise ratio.

Extended sensor information such as temperature monitoring, mechanical stress monitoring or supply voltage monitoring is thus not available at the sensor outputs. In the event of a sensor error (internal or external), the state is indicated by setting the available output signals to a safe state (for example on-chip debugging, which indicates the error state using an active permanent state). If additional parameters (for example busbar temperature) are needed, additional sensor elements (and the respective inputs thereof on the evaluation microcontroller) need to be implemented.

Test methods required for checking the integrity of an analog signal chain are conventionally initiated after startup or by producing a starting condition on one of the direct sensor-microcontroller connections of the sensor system. This strategy either requires a large number of pins both on the sensor and on the microcontroller and/or there is a lack of flexibility for controlling the required test sequences.

SUMMARY

An improved communication for control and diagnosis between the microcontroller and one or more sensor chips may be achieved by apparatuses and methods described herein.

According to a first aspect of the present disclosure, a sensor system is proposed that comprises a microcontroller and at least one sensor chip. The sensor chip is designed to measure at least one physical quantity. The microcontroller and the sensor chip are coupled to one another via at least one analog signal interface for conveying analog measurement data between the sensor chip and the microcontroller and via at least one digital signal interface for conveying digital secondary information between the sensor chip and the microcontroller.

According to some example implementations, the digital signal interface between the sensor chip and the microcontroller is a bidirectional interface, which means that digital data can be transmitted in both directions from the microcontroller to the sensor chip and from the sensor chip to the microcontroller. The digital signal interface between the sensor chip and the microcontroller may be in the form of a bidirectional 1-line interface. Hardware and wiring complexity can therefore be kept down.

According to some example implementations, the digital signal interface between the sensor chip and the microcontroller is in the form of a single-master (microcontroller) multi-slave (sensor chips) bus system. Only the microcontroller thus gives commands and makes requests; the sensor chips merely react. Numerous sensors can therefore easily be interfaced with the microcontroller.

According to some example implementations, the microcontroller and the sensor chip are coupled to one another in parallel via the analog signal interface and the digital signal interface. This allows analog measurement signals and digital control and/or diagnosis signals to be conveyed between the sensor chip and the microcontroller in parallel (sometimes even simultaneously).

According to some example implementations, the sensor chip comprises a magnetic field sensor. This can be a magnetic field sensor for current measurement, such as for example a Hall sensor or a magnetoresistive sensor (AMR, GMR or TMR sensor). As already mentioned at the outset, current measurement is of interest for applications relating to electromobility, for example. The proposed design may naturally also be of interest for other sensor types, such as for example angle sensors, position sensors, etc. Besides a primary sensor, the sensor chip can naturally also comprise further secondary sensors, such as for example temperature or pressure sensors.

According to some example implementations, the digital signal interface is designed to convey digital configuration and/or calibration data and/or digital measurement data between the microcontroller and the sensor chip. The microcontroller can comprise for example a nonvolatile memory for the configuration and/or calibration data and may be designed to send the data to the sensor chip via the digital signal interface when the sensor chip is started up. This allows an end-of-line (EoL) calibration to be simplified, since no programmer and no programming step are used. In addition, a nonvolatile (NVM) memory in the sensor chip for storing calibration parameters can be eliminated. This allows costs for the sensor system to be reduced.

According to some example implementations, the microcontroller is designed to use the digital signal interface to dynamically vary operating parameters of the sensor chip. Some examples of operating parameters are supply voltage, signal gain, bias current, etc. The operating parameters can therefore be adapted to suit varying environments or measurement demands.

According to some example implementations, the sensor chip is designed to use the digital signal interface to provide the microcontroller with diagnosis data. Some examples of diagnosis data are operating temperature, error diagnosis data, etc. This can allow a selective and extended diagnosis, which is used for high-availability systems and preventive maintenance. Imminent failures in a sensor can thus sometimes be detected early.

According to some example implementations, the microcontroller is designed to use the digital signal interface to communicate predefined test sequences to the sensor chip. This allows the concept of functional safety to be simplified at application level (controlled test sequence).

According to some example implementations, the microcontroller is designed to set a variable data rate for the digital signal interface from a predefined range. The data rate can therefore be adapted to suit specific measurement demands, for example. Some physical variables are to be measured frequently for some applications; for other applications, they or other physical variables are to be measured less frequently.

According to some example implementations, the sensor system comprises a plurality of sensor chips that are interfaced with the microcontroller via the digital signal interface as data bus. The microcontroller is designed to use the digital signal interface to provide an addressing command to the sensor chips. Each of the sensor chips is designed to respond to the addressing command by using its respective analog signal interface or its respective digital signal interface to convey a random output signal to the microcontroller. Each of the sensor chips is designed to receive a unique address in response to its random output signal. According to some example implementations, the microcontroller is designed to allocate each of the sensor chips a unique address on the basis of the random output signals. The microcontroller can use the digital signal interface to allocate each of the sensor chips its unique address. The sensor chips can therefore be allocated and notified of addresses for the further communication between the microcontroller and the sensor chips in an initial addressing phase using an unsophisticated addressing protocol.

According to a further aspect of the present disclosure, a method for communication between a microcontroller and at least one sensor chip is proposed. The method comprises conveying analog measurement data between the sensor chip and the microcontroller via at least one analog signal interface and conveying digital secondary information between the sensor chip and the microcontroller via a digital signal interface that is in parallel with the analog signal interface. According to some example implementations, the digital signal interface between the sensor chip and the microcontroller is in the form of a bidirectional single-master multi-slave bus interface, in which the microcontroller acts as master and the sensor chip(s) act(s) as slave(s).

According to yet a further aspect of the present disclosure, a sensor chip is proposed, having at least one sensor circuit designed to respond to a physical quantity to be measured by providing an analog measurement signal, at least one analog signal interface designed to convey the analog measurement signal from the sensor chip to a microcontroller, and a (bidirectional) digital signal interface designed to convey digital secondary information (for example digital configuration and/or calibration data or else digital measurement data) between the sensor chip and the microcontroller.

According to some example implementations, the sensor circuit comprises a current sensor circuit that has one or more magnetic field sensors.

According to some example implementations, the analog and digital signal interfaces are designed to transmit analog and digital signals between the sensor chip and the microcontroller in parallel or even simultaneously.

According to some example implementations, the sensor chip is designed to use the digital signal interface to provide the microcontroller with diagnosis data (for example temperature, stress, supply voltage, etc.).

According to some example implementations, the sensor chip is designed to use the digital signal interface to receive configuration and/or calibration data from the microcontroller and to set operating parameters of the sensor chip on the basis thereof.

Example implementations of the present disclosure thus propose a bidirectional, digital control and diagnosis interface between the microcontroller and the sensor chip that allows both the upload of sensor data to the microcontroller and the download of data to the sensor chip. The data to be transmitted to the sensor chip can comprise configuration information, such as for example gain and offset settings, test patterns, for example for testing a signal processing path, and calibration information.

BRIEF DESCRIPTION OF THE FIGURES

A few examples of apparatuses and/or methods are explained in more detail below merely by way of example with reference to the accompanying figures, in which.

DESCRIPTION

Various examples are now described more thoroughly with reference to the accompanying figures, which depict a few examples. The thicknesses of lines, layers and/or regions in the figures may be exaggerated for clarification purposes.

While further examples are suitable for various modifications and alternative forms, some specific examples thereof are accordingly shown in the figures and are described thoroughly below. However, this detailed description does not restrict further examples to the specific forms described. Further examples can cover all modifications, counterparts and alternatives that fall within the scope of the disclosure. Throughout the description of the figures, identical or similar reference signs refer to identical or similar elements which can be implemented identically or in modified form in comparison with one another, while they provide the same or a similar function.

It goes without saying that if one element is referred to as "connected" or "coupled" to another element, the elements can be connected or coupled directly or via one or more intermediate elements. If two elements A and B are combined using an "or", this should be understood such that all possible combinations are disclosed, e.g. only A, only B, and A and B, unless explicitly or implicitly defined otherwise. An alternative wording for the same combinations is "at least one of A and B" or "A and/or B". The same applies, mutatis mutandis, to combinations of more than two elements.

The terminology used here to describe specific examples is not intended to have a limiting effect for further examples. When a singular form, e.g. "a, an" and "the", is used, and the use of only a single element is defined neither explicitly nor implicitly as obligatory, further examples can also use plural elements in order to implement the same function. If a function is described below as implemented using multiple elements, further examples can implement the same function using a single element or a single processing entity. Furthermore, it goes without saying that the terms "comprises", "comprising", "has" and/or "having" in their usage specify the presence of the indicated features, integers, steps, operations, processes, elements, components and/or a group thereof, but do not exclude the presence or addition of one or more other features, integers, steps, operations, processes, elements, components and/or a group thereof.

Unless defined otherwise, all terms (including technical and scientific terms) are used here in their customary meaning in the field with which examples are associated.

Figure 1A:
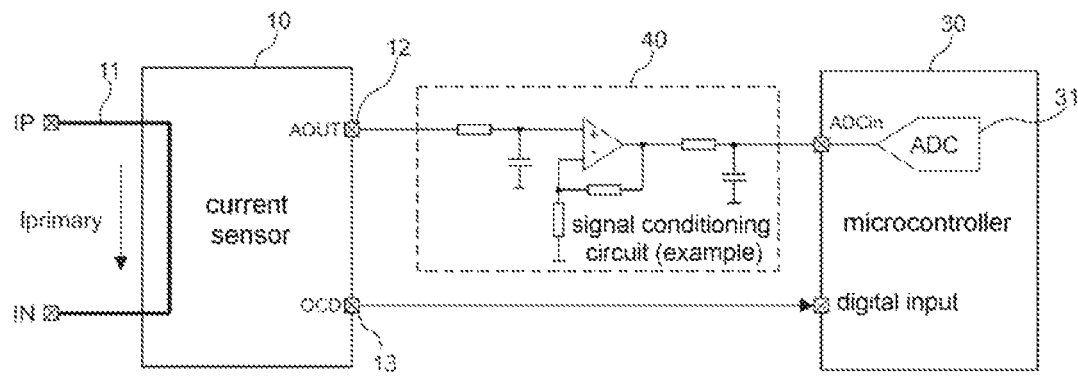
FIG. 1A shows a block diagram of a conventional sensor system having a microcontroller and a current sensor chip.

FIG. 1A shows a conventional system comprising a current sensor chip 10 and a microcontroller 30.

The current sensor chip 10 measures a current in a line 11 and provides an analog measurement signal on a unidirectional analog signal interface 12 (AOUT). A unidirectional overcurrent interface 13 (OCD: OverCurrent Detection) of the current sensor chip 10 can be used to indicate an overcurrent signal to the microcontroller 30, which signal signals whether the measured current is above a threshold value. The overcurrent signal may be a digital or binary signal (e.g. "high"=current too high, "low"=current not too high). The analog signal path between the analog signal interface 12 of the current sensor chip 10 and an ADC 31 of the microcontroller 30 has an analog circuit 40 for signal conditioning. In order to provide a functionally safe sensor system, the implementation shown in FIG. 1A has the entire signal chain from the sensor chip 10 to the output of the ADC 31 monitored.

Figure 1B:
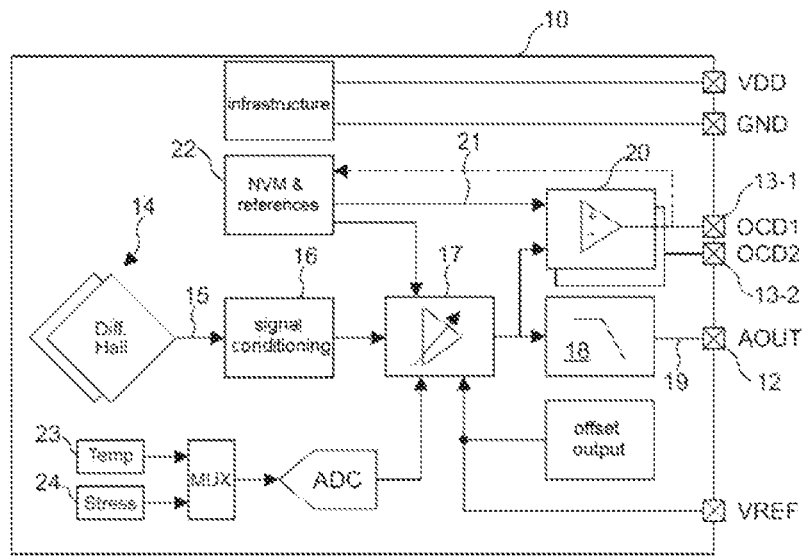
FIG. 1B shows a block diagram of a current sensor chip.

A possible implementation of the current sensor chip 10 is shown in FIG. 1B.

The current through the line 11 is measured using a differential Hall sensor 14 as primary sensor. A resultant analog raw measurement signal 15 is supplied to an analog signal conditioning circuit 16, an analog amplifier circuit 17 and an analog filter circuit 18 before the resultant filtered analog measurement signal 19 is provided on the analog signal interface 12 (AOUT). An amplified measurement signal at the filter input is additionally supplied to one or more overcurrent detection circuits 20 in order to compare it with one or more threshold values 21. The overcurrent detection circuits 20 provide (digital) overcurrent signals on one or more unidirectional overcurrent interfaces 13. The (programmable) threshold values 21 can be stored in a nonvolatile memory 22 of the current sensor chip 10. Further, the current sensor chip 10 shown here additionally contains a secondary temperature sensor 23 and a secondary mechanical stress sensor 24, the measurement signals of which influence a gain of the analog amplifier circuit 17 and can therefore be used for temperature and stress compensation.

Figure 1C:
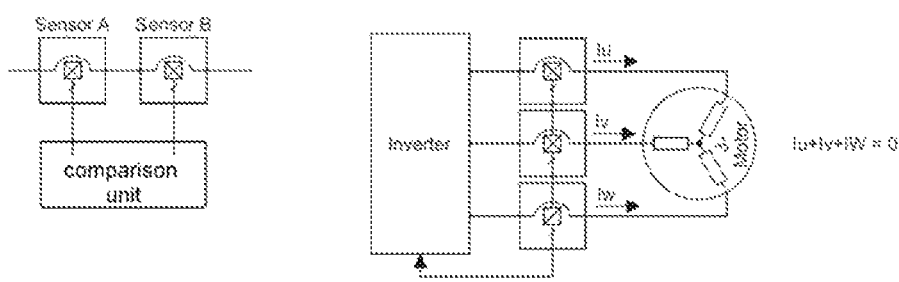
FIG. 1C shows a depiction of conventional functionally safe sensor systems.

In conventional implementations, the integrity of sensor reading can be checked by adding redundancy in the system. In some implementations, this is accomplished by doubling the number of sensors (for example for battery management systems), as shown in FIG. 1C (left). In electrical drive applications (see FIG. 1C, right), it is possible to employ current sensors in all of the phases. Since the sum of all currents must be zero (provided that there is no leakage current), the integrity of the sensor system (consisting of the sensors for all of the phases) can be checked. However, it is not possible to identify a single sensor that causes an incorrect output value, which is a problem particularly in high-availability systems, which must continue to operate despite a single error, for example a faulty sensor.

Figure 1D:
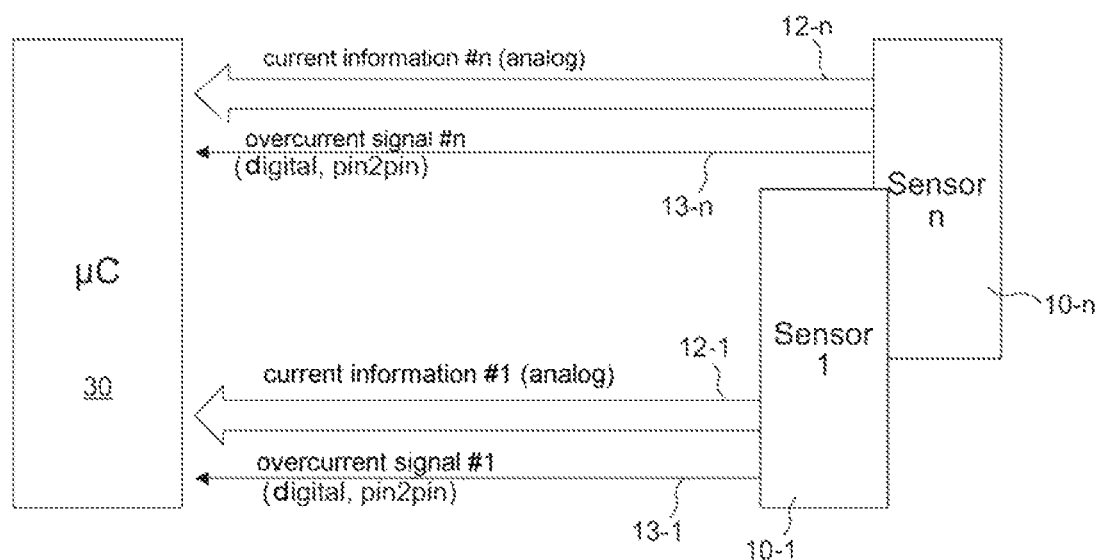
FIG. 1D shows a block diagram of a conventional sensor system having a microcontroller and n sensor chips.

In conventional sensor systems, there is thus merely a unidirectional flow of information from the sensor chip 10 to the microcontroller 30 via the signal interfaces 12 and 13. This is shown schematically in FIG. 1D for n sensors 10-1, . . . , 10-n on a microcontroller (μC) 30. Diagnosis modes for the sensors 10-1, . . . , 10-*n* are difficult to initiate and there is no (dynamic) change of sensor settings. Furthermore, nonvolatile memories 22 in the current sensor chips 10-1, . . . , 10-*n* are programmed in an EoL programming. There is furthermore also no transmission channel for additional sensor information (for example functional safety or diagnosis).

Figure 2A:
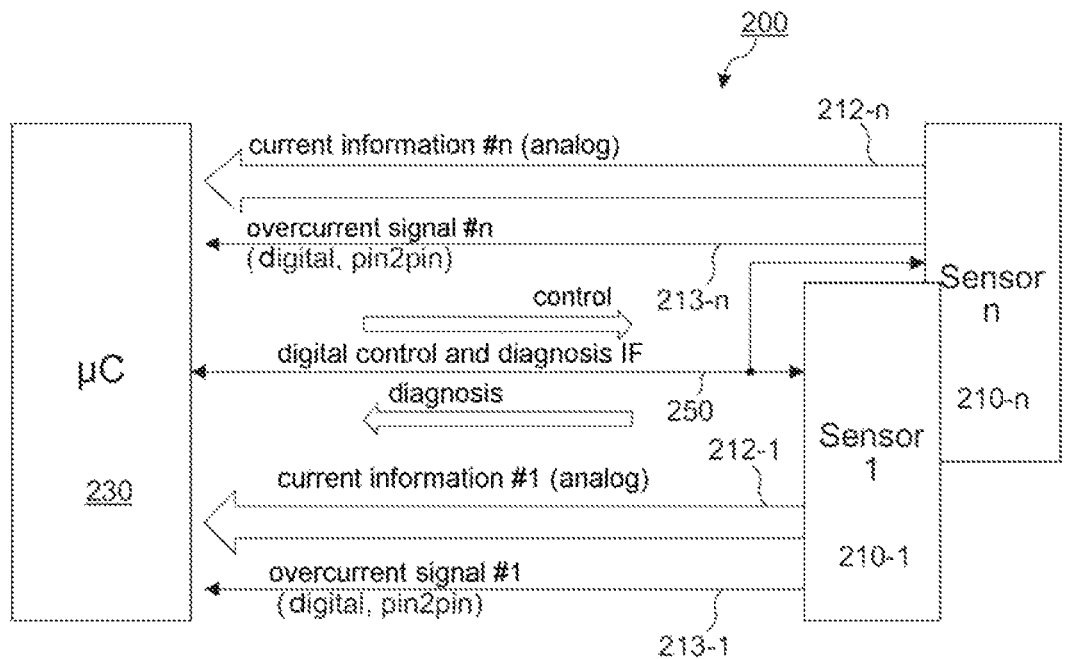
FIG. 2A shows a block diagram of a sensor system having a microcontroller and n sensor chips according to one example implementation.

In order to overcome at least some of these disadvantages, a contrastingly improved sensor system 200 is proposed, which is depicted schematically in FIG. 2A.

The sensor system 200 comprises a microcontroller 230 and at least one sensor chip 210. In the example implementation shown, there are n sensor chips 210-1, . . . , 210-*n* present (n=1, 2, 3, . . . ). Each of the sensor chips 210-1, . . . , 210-*n* is designed to measure at least one physical quantity, such as for example a magnetic field or an electric current. The microcontroller 230 and the sensor chips 210-1, . . . , 210-*n* are coupled via n unidirectional analog signal interfaces for conveying analog measurement data from the respective sensor chip 210-1, . . . , 210-*n* to the microcontroller 230. From each sensor chip 210-1, . . . , 210-*n*, at least one analog line 212-1, . . . , 212-*n* is thus routed to the microcontroller 230. From each sensor chip 210-1, . . . , 210-*n*, it is optionally also possible for a unidirectional digital overcurrent interface 213-1, . . . , 213-*n* to be routed to the microcontroller 230. The microcontroller 230 and the sensor chips 210-1, . . . , 210-*n* are additionally coupled to one another via a bidirectional digital signal interface 250 for conveying digital secondary information between the sensor chips 210-1, . . . , 210-*n* and the microcontroller 230.

The digital secondary information is not a unidirectional 1-bit overcurrent indicator. According to some example implementations, the digital secondary information is also not measured values of the physical quantity that is primarily measured (for example magnetic field, current, angle, etc.), since these are conveyed in analog fashion via the lines 212-1, . . . , 212-*n*, of course. Instead, it may be contrasting digital sensor control data (commands), sensor diagnosis data, configuration and/or calibration data, sensor parameters, etc. The digital secondary information via the bidirectional digital signal interface 250, such as for example control commands, addresses, data, can have far more than just one bit.

In order to increase functional safety of the sensor system 200, there may be provision in some implementations, however, for digital measured values of the physical quantity that are to be measured to also be transmitted from at least some of the sensor chips 210-1, . . . , 210-*n* to the microcontroller 230 via the bidirectional digital signal interface 250 in addition to the analog measured values via the analog lines 212-1, . . . , 212-*n*.

In order both to solve the diagnosis problem and to allow transmission of extended diagnosis information between a sensor chip 210-1, . . . , 210-*n* and the microcontroller 230, a bidirectional, digital control and diagnosis interface 250 (DCDI) is thus proposed. The bidirectional digital signal interface 250 can then allow the following functions:

a) Download of configuration and calibration data during startup. The applicable information can be stored in a nonvolatile memory of the microcontroller 230 and loaded into a sensor chip 210 when the sensor chip is switched on.

b) Dynamic adaptation of the sensor parameters. Critical parameters such as bandwidth, gain and offset of individual sensor chips 210-1, . . . , 210-*n* can be adjusted during normal operation of the sensor chip.

c) Upload of extended diagnosis information. Available diagnosis data inside a sensor chip 210 can be monitored via the diagnosis interface 250. The sensor chip 210 can deliver e.g. realtime information about the supply voltage monitoring, a busbar temperature, etc.

d) Controlled activation of test sequences. In order to activate a test sequence, the microcontroller 230 can perform timely activation of a test sequence. As an example, a sensor chip 210 can be forced to imitate a defined current pattern so as not only to monitor the integrity of the sensor but also to check the integrity of the entire signal processing path from the sensor chip 210 to the μC processing core.

Figure 2B:
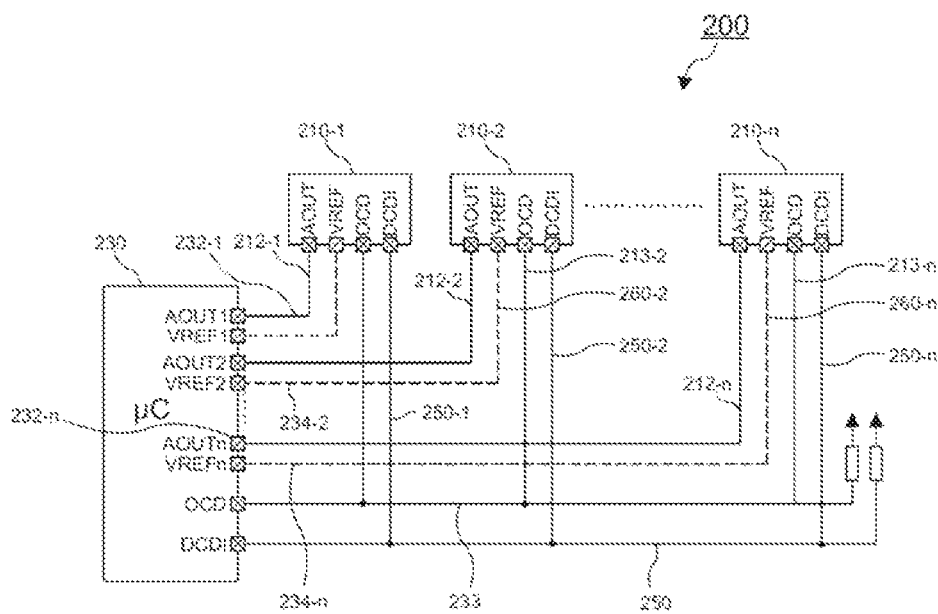
FIG. 2B shows a block diagram of a sensor system having a microcontroller and n sensor chips according to a further example implementation.

FIG. 2B schematically shows a microcontroller 230 coupled to a plurality of n sensor chips 210-1, . . . , 210-*n* via analog and digital interfaces.

Each of the sensor chips 210-1, . . . , 210-*n* has a respective unidirectional analog signal output via lines 212-1, . . . , 212-*n* (AOUT) for a current measurement signal. The microcontroller 230 provides appropriate analog signal inputs 232-1, . . . , 232-*n* therefor. Each of the sensor chips 210-1, . . . , 210-*n* has a respective unidirectional digital overcurrent output 213-1, . . . , 213-*n* (OCD), which is coupled by the microcontroller 230 to the overcurrent interface 233 thereof. Each of the sensor chips 210-1, . . . , 210-*n* has a respective bidirectional digital control and diagnosis interface 250-1, . . . , 250-*n* (DCDI), which are coupled by the microcontroller 230 to the bidirectional digital control and diagnosis interface 250 thereof. Optionally, the sensor chips 210-1, . . . , 210-*n* each also have an analog input 260-1, . . . , 260*n* for a setting voltage (VREF) for setting an operating point of the respective analog amplifier circuit 17. The microcontroller 230 provides appropriate analog signal outputs 234-1, . . . , 234*n* therefor.

The unidirectional analog signal outputs on lines 212-1, . . . , 212*n* and the bidirectional digital signal interface 250 can be used to convey analog and digital signals between the sensor chips 210-1, . . . , 210*n* and the microcontroller 230 in parallel. While analog measurement signals (for example current measurement signals) go to the microcontroller 230 via the signal outputs on lines 212-1, . . . , 212*n* of the sensor chips 210-1, . . . , 210*n*, the digital signal interface 250 can be used to interchange other, digital data between the microcontroller 230 and the sensor chips 210-1, . . . , 210*n*. As indicated in FIG. 2B, the bidirectional digital signal interface 250 between the sensor chips 210-1, . . . , 210*n* and the microcontroller 230 may be in the form of a bidirectional 1-line interface and act as a single-master (microcontroller 230) multi-slave (sensor chips 210-1, . . . , 210*n*) bus system. The microcontroller 230 thus gives commands and makes requests; the sensor chips 210-1, . . . , 210*n* merely react. The bus master controls the flow of communication by sending master request frames to the sensor bus. Depending on the master request frames, information is transmitted to the sensor (write frame) or received from the sensor (read frame). It is therefore easily possible for numerous sensors to be interfaced with the microcontroller 230. The digital control and diagnosis interface 250 may be in the form of a single-wire UART interface (UART=Universal Asynchronous Receiver Transmitter), for example.

Figure 3A:
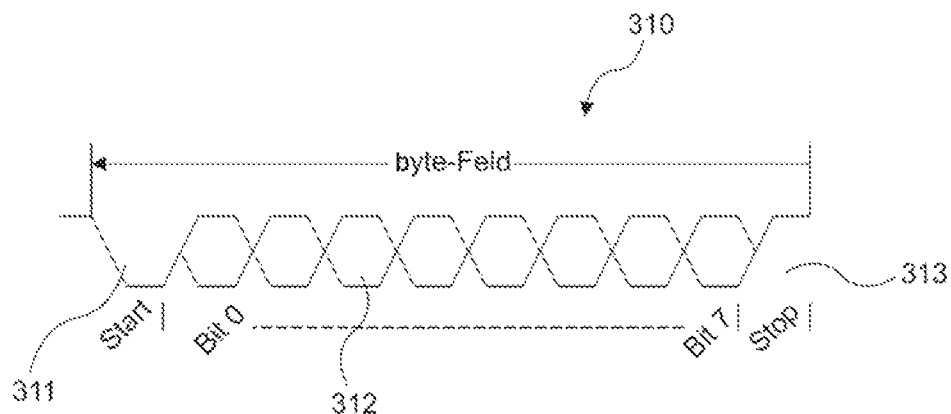
FIG. 3A shows a possible data frame for conveying digital secondary information between the sensor chip and the microcontroller.

Digital secondary information can be transmitted between the microcontroller 230 and the sensor chips 210-1, . . . , 210*n* via the digital control and diagnosis interface 250 as a serial digital data stream having fixed frames. As depicted in the example in FIG. 3A, a frame 310 can comprise a start bit 311, some data bits 312, an optional parity bit for detecting transmission errors and a stop bit 313. The transmitter does not need to notify the receiver of the transmission clock via a separate control line. Instead, the receiver can calculate the clock of the transmitter from the clock of the data line and synchronize itself thereto using the start and stop bits. The frames 310 can be encoded as 8-bit UART frames, for example. Information can be transmitted on a physical layer comprising a single wire. For example, there may be provision for a baud rate, programmable via the microcontroller 230, of e.g. 38.4 kbit/s to 115.2 kbit/s (for example 4 speeds). By way of example, the line code used for transmitting information can be a Manchester code or a Non-Return-to-Zero (NRZ) or Non-Return-to-Zero-Inverted (NRZI) coding.

Different types of communication can take place between the microcontroller 230 and the sensor chips 210-1, . . . , 210n. A first possible communication is shown in FIG. 3B (top).

Figure 3B:
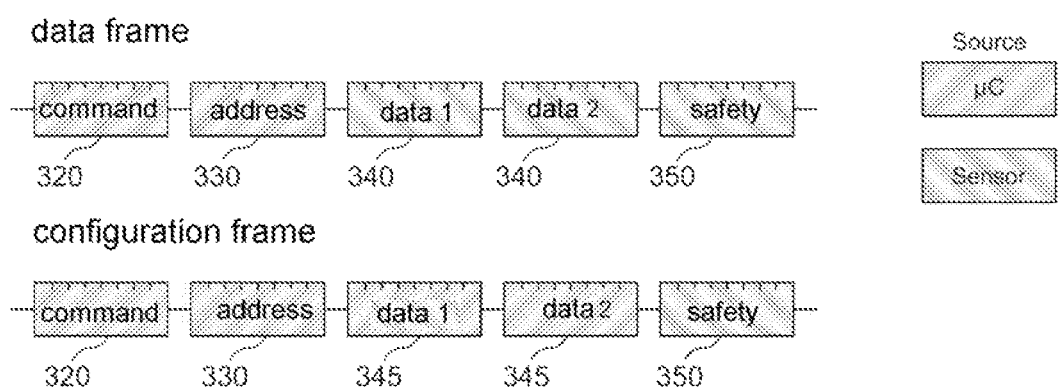
FIG. 3B shows designs for conveying digital secondary information between the sensor chip and the microcontroller.

FIG. 3B (top) shows a possible data communication relating to a request for sensor data—such as e.g. sensor state data or diagnosis data—by the microcontroller 230. The microcontroller 230 first uses a command frame 320 to request specific sensor state data or diagnosis data via the digital signal interface 250. Depending on the number of possible commands, a corresponding number of bits can be used for encoding them. The microcontroller 230 uses a subsequent address frame 330 via the digital signal interface 250 to indicate which of the sensor chips 210-1, . . . , 210n it would like the sensor state data or diagnosis data from. Depending on the number of possible addresses, a corresponding number of bits can be used for encoding them. On the basis of the sensor ID contained in the address frame 330, the addressed sensor chip conveys the requested sensor state data or diagnosis data to the microcontroller 230 in one or more data frames 340, followed by a safety data frame 350. It will be obvious to a person skilled in the art that an order for the depicted command, address and data frames could also be chosen differently.

FIG. 3B (bottom) further shows a possible data communication relating to a sending of data—such as e.g. configuration or control data—from the microcontroller 230 to a sensor chip 210. The microcontroller 230 first uses a command conveyed in a command frame 320 to announce the configuration or control data via the digital signal interface 250. The microcontroller 230 uses an address frame 330 to indicate via the digital signal interface 250 which of the sensor chips 210-1, . . . , 210n it would like to convey the configuration or control data to. The microcontroller 230 subsequently conveys the announced configuration or control data to the previously addressed sensor chip 210 in one or more data frames 345 via the digital signal interface 250. The sensor chip 210 confirms receipt of the data with a safety data frame 350 via the digital signal interface 250. It will be obvious to a person skilled in the art that in this case too an order for the depicted command, address and data frames could also be chosen differently.

Bus collisions can be prevented by the master-slave control principle.

The communication is controlled by the (single) bus master (microcontroller 230) by transmitting a command frame or address frame. Each frame transmitted by the bus master 230 contains address information that is used to address the sensors 210-1, . . . , 210n individually. Only following successful receipt of the address frame and concordant address information does the addressed slave sensor 210-1, . . . , 210n transmit its information to the digital signal interface 250.

For this addressing principle to work, each bus slave of slave sensors 210-1, . . . , 210n has an allocated biunique address. This allocation can be accomplished in a wide variety of ways. First, the bus address could be provided by hardware solutions, such as e.g. address-specific circuitry for the individual sensors 210-1, . . . , 210n. Alternatively, it would also be possible to write the biunique addresses to a nonvolatile memory of the sensors 210-1, . . . , 210n involved using a programming step before the sensor network is started up. Both the hardware circuitry and the programming of the individual sensors 210-1, . . . , 210n have the disadvantage that either an additional programming step is used during manufacture or multiple different components (sensor modules) are to be kept in accordance with the number of bus subscribers.

It is therefore advantageous to introduce an auto-addressing mechanism that can be used to allocate biunique addresses to the individual bus subscribers of sensors 210-1, . . . , 210n dynamically, that is to say during system initialization. While various auto-addressing methods are already known (e.g. daisychain method), the presence of one or more analog, biunique sensor-to-microcontroller connections is advantageously used in the present case.

For the auto-addressing, the bus master 230 can use a first command transmitted via the digital signal interface 250 to reset the sensor addresses of all of the bus slaves of slave sensors 210-1, . . . , 210n involved. The bus master 230 can then use a second command to stimulate the generation of random addresses in the individual slave sensors 210-1, . . . , 210n. These are then transmitted to the bus master 230 by using an analog connection and/or the digital signal interface 250. Those sensors 210-1, . . . , 210n that already have a biunique address available are allocated, by the bus master 230, an address that is used in the application. For those sensors 210-1, . . . , 210n that have not yet generated a biunique address using the random generation, the bus master 230 is used to initiate a new random cycle with a further rating loop. The very low probability of identical random addresses in combination with multiple iterations thus allows the address allocation to be performed very efficiently.

According to one possible example implementation, after receiving the command to generate a random address, each sensor 210-1, . . . , 210n can generate its address and output it to the digital signal interface 250 as a digital bit stream. This can involve an asymmetric output stage being used, which means that a logic level is output to the digital interface 250 much more weakly than the opposite level. In the event of a bus conflict, the stronger output stage overrides the respective weaker one (dominant as opposed to recessive level). The sensors 210-1, . . . , 210n continuously monitor the data stream that is output. In the event of a bus conflict with a recessive output level, the affected sensor 210-1, . . . , 210n detects the conflict and resolves it by switching the output stage of the digital signal interface 250 to high impedance. After the sensor 210-1, . . . , 210n has output its random address, the success or failure (detected bus conflict) is indicated using a respective defined level on the analog output line 212-1, . . . , 212n. This allows the bus master 230 to tell which sensor has successfully completed the cycle with the address received from it. In this case, the successful sensor can be allocated an address and a next arbitration cycle can be initiated.

During an initial bus setup phase (address allocation), it is thus possible for bus collisions (multiple slaves transmitting data to the bus simultaneously) to occur. The bus setup phase can be initiated using a dedicated frame (arbitration frame) to allocate unique addresses to individual sensors. The frame contains an addressing command that is used to initiate the address allocation. For the bus setup phase, the microcontroller 230 may thus be designed to use the digital signal interface 250 to provide an addressing command to the sensor chips 210-1, . . . , 210n. Each of the sensor chips 210-1, . . . , 210n may be designed to respond to the addressing command by using its respective analog signal line 212-1, . . . , 212n or its respective digital signal interface 250-1, . . . , 250-n to convey a random output signal to the microcontroller 230. Each of the sensor chips 210-1, . . . , 210n may be designed to receive, from the microcontroller 230, a unique address in response to its random output signal. According to some example implementations, the microcontroller is designed to allocate each of the sensor chips a unique address on the basis of the random output signals. The microcontroller 230 can use the digital signal interface to allocate each of the sensor chips its unique address. The sensor chips 210-1, . . . , 210n can therefore be allocated and notified of addresses for the further communication between the microcontroller and the sensor chips in an initial addressing phase using an unsophisticated addressing protocol.

Figure 4A:
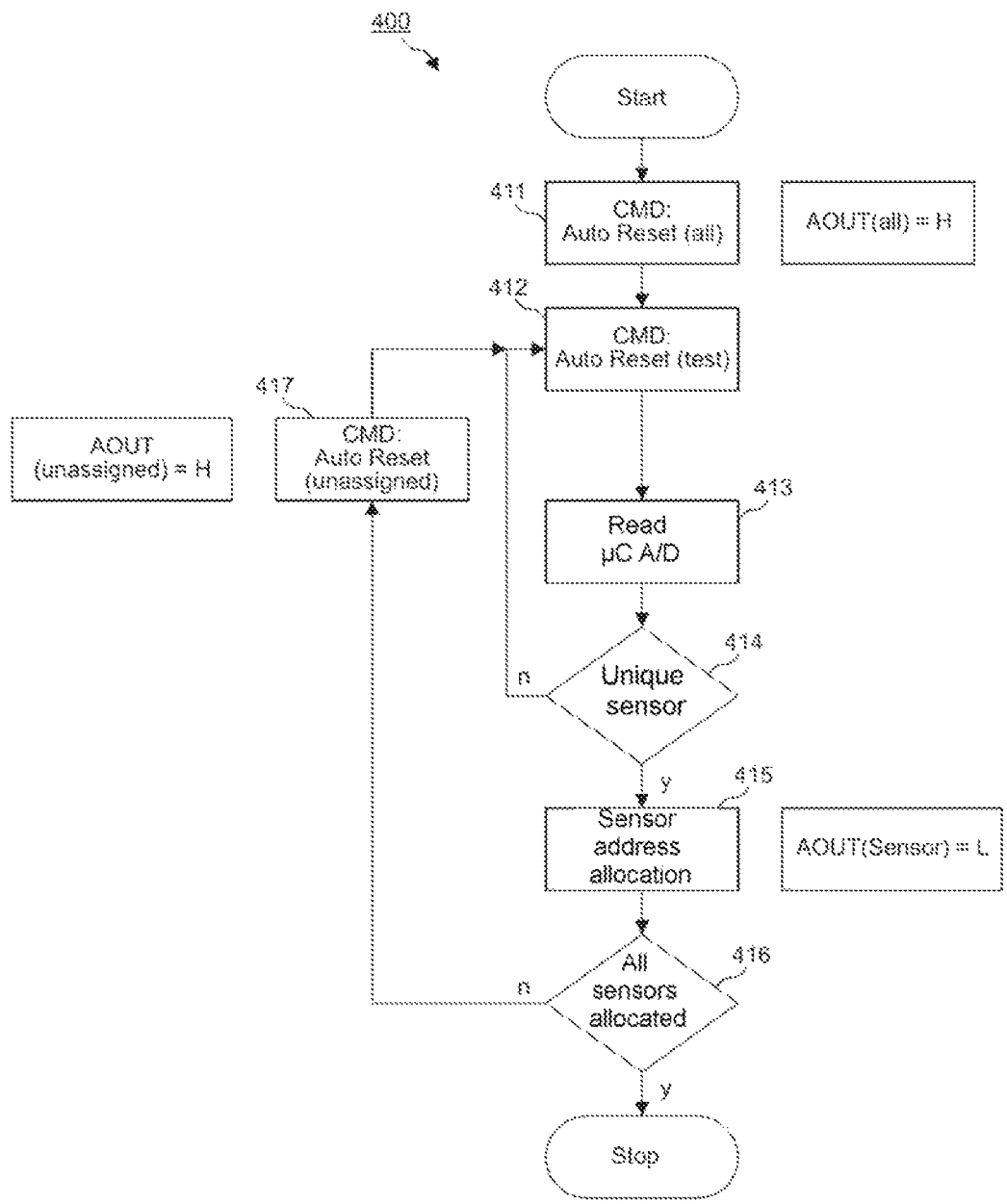
FIG. 4A shows a possible sequence of an address allocation to sensor chips from the point of view of the microcontroller.

FIG. 4A depicts an example implementation of a method 400 for address allocation from the point of view of the microcontroller 230.

A command "Auto_Reset.all" via the digital signal interface 250 is first used by the microcontroller 230 at 411 to instruct all sensor chips 210-1, . . . , 210n to set their analog output interfaces 212-1, . . . , 212n to "high" (H). The microcontroller 230 subsequently provides a further command "Auto_Reset.test" via the digital signal interface 250 at 412. In response to the command "Auto_Reset.test", each sensor chip 210-1, . . . , 210n uses its respective digital signal interface 212-1, . . . , 212n to output a random digital output signal. After the sensor chip 210-1, . . . , 210n has output its random address, the success or failure (detected bus conflict) is indicated using a respective defined level on the analog output line 212-1, . . . , 212n. The analog output signals can then be read at 413 via the analog signal inputs 232-1, . . . , 232n of the microcontroller 230 and the ADCs thereof. It is therefore possible for the microcontroller 230 to tell which sensor chip 210-1, . . . , 210n has successfully completed the cycle with the address received from it. In this case a successful sensor chip 210-1, . . . , 210n can be allocated an address at 415. If the analog output signal from a sensor thus indicates no bus conflict (success), this sensor can be allocated an address via the digital signal interface 250 at 415. As a result, its analog output signal is set e.g. to "L" for the duration of the addressing method 400. If the analog output signal from the sensor indicates a bus conflict (failure), step 412 is repeated until no further conflicts have been able to be detected. After the one sensor has been allocated an address at 415, a test is performed at 416 to determine whether all of the sensors 210-1, . . . , 210n have already been allocated an address. If this is not the case, the command "Auto Reset (unassigned)" is used to set the analog output interfaces 212 of all the remaining sensors without an allocated address to "H" at 417 and then to put them back into the random mode at 412.

Figure 4B:
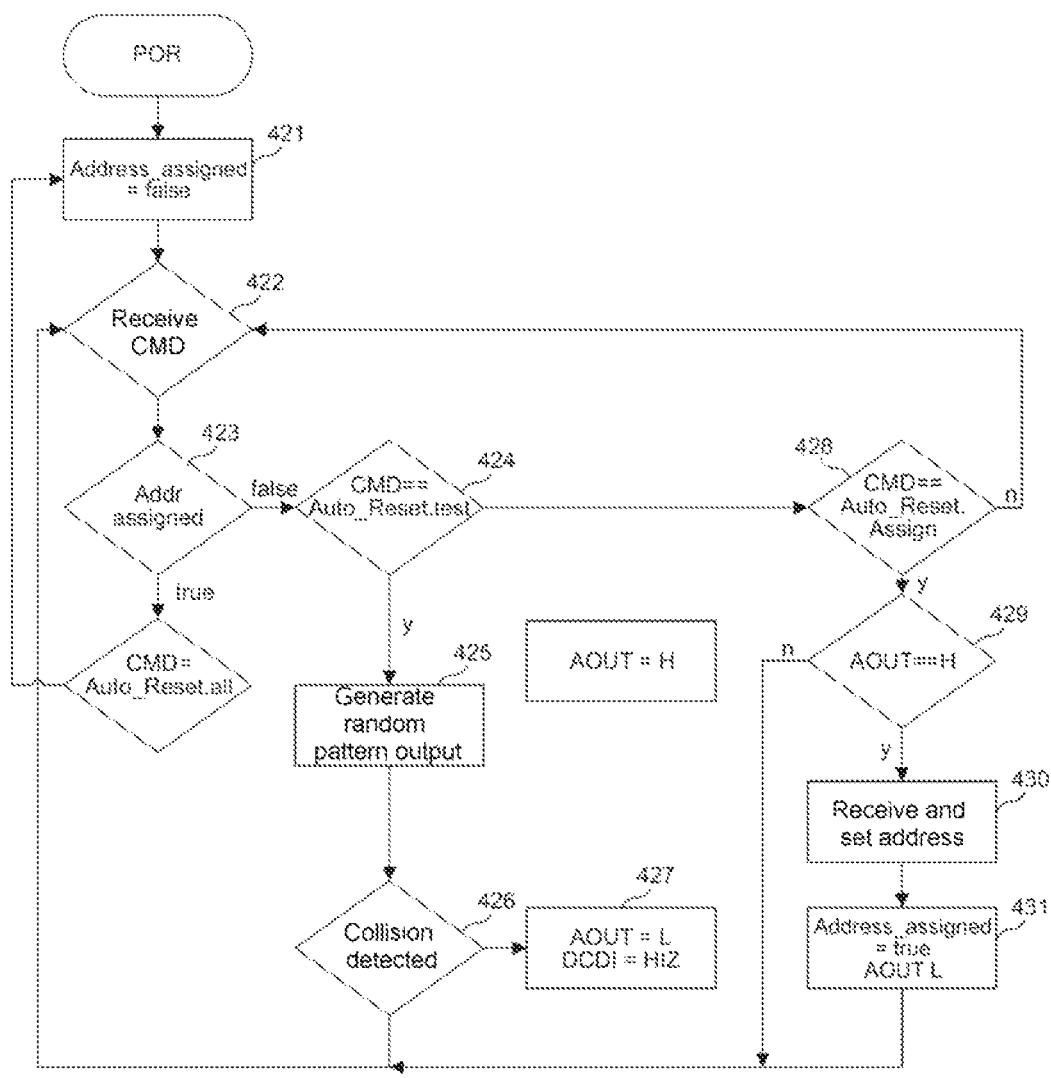
FIG. 4B shows a possible sequence of an address allocation to sensor chips from the point of view of a sensor chip.

FIG. 4B describes the method 400 for address allocation from the point of view of a sensor chip 210.

First, a logical variable "Address_assigned" is set to "false" at 421. This means that the sensor chip has not yet been allocated an address. At 422 and 423 the sensor chip 210 checks whether a command has been received from the microcontroller via the digital signal interface 250, and the state of the logical variable "Address_assigned". If the logical variable "Address_assigned"="false", the sensor checks at 424 whether the received command corresponds to "Auto_Reset.test". If this is the case, the sensor chip 210 uses its digital signal interface 250 to output a random digital output signal. The digital output signal can then be subjected to a collision test at 426. In the event of a collision with other sensor chips, the analog output signal is set to "L" at 427, the output stage of the digital signal interface 250 is switched to high impedance and the method is continued at 422 by waiting for a new command. If a collision with other sensor chips is not detected, the method is likewise continued at 422 by waiting for a new command "Auto_Reset.Assign". If this command was received at 428, a check is performed at 429 to determine whether the analog output interface 212 of the sensor chip 210 is at "high" (H). If this is the case, the sensor is allocated an address via the digital signal interface 250 at 430. The logical variable "Address_assigned" is subsequently set to "true" at 431 and the analog output signal is set to "L" for the duration of the addressing method 400. The method is then continued at 422 by waiting for a new command.

In an alternative implementation, the initialization command (e.g. "Auto_Reset.all") can be followed by a second command (e.g. "Auto_Reset.test") again being used to generate random addresses. In this implementation the addresses are output on one of the analog lines 212 or 260 as a representative voltage via a digital-to-analog converter. By reading in the analog voltages, the bus master 230 detects uniqueness of the addresses or possible overlaps. The sensors 210-1, . . . , 210n that have generated a unique address are allocated a productive address via the digital signal interface 250. The sensors with the same address undertake a new cycle to generate a random address.

Figure 5:
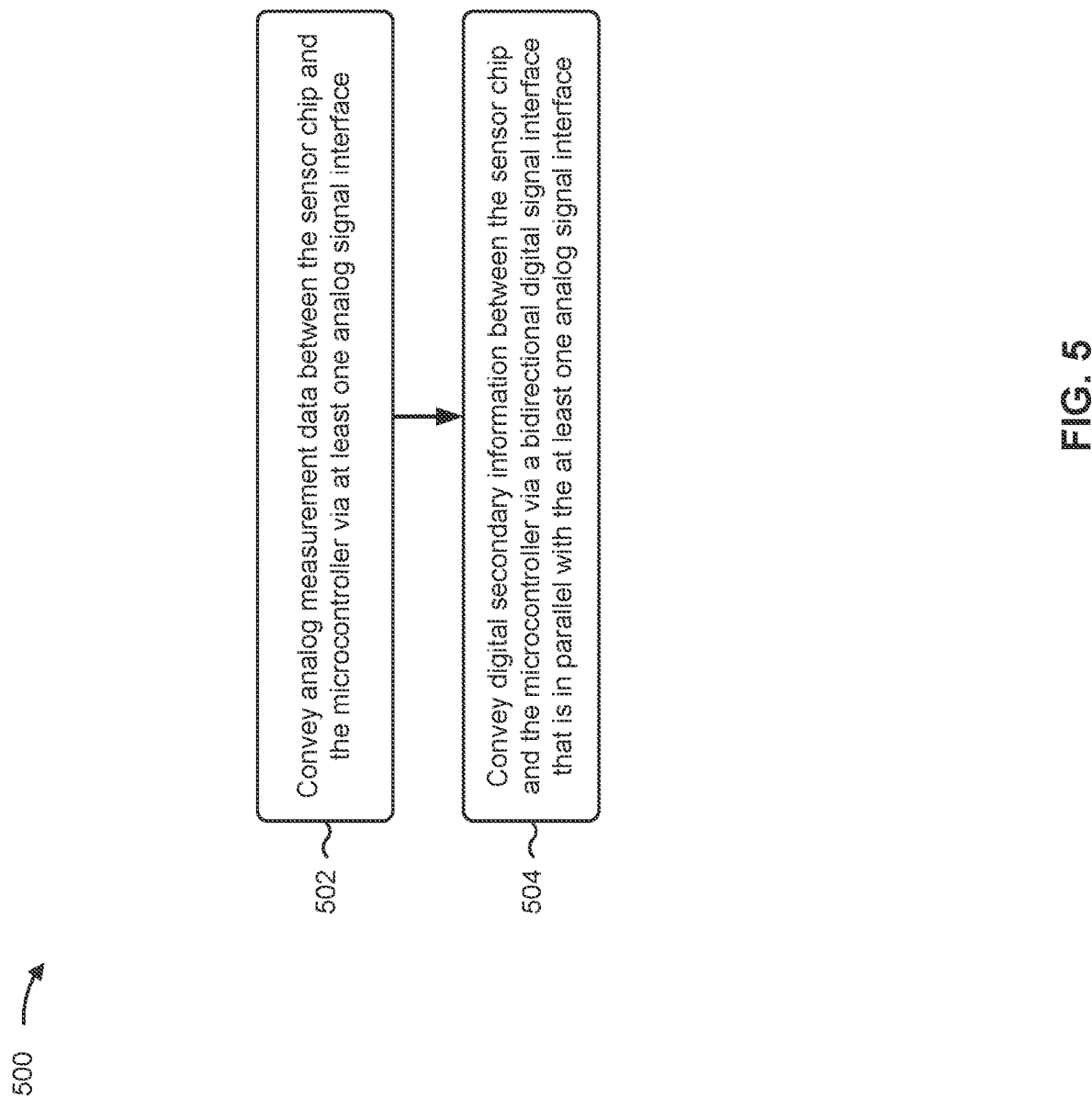
FIG. 5 shows a method for communication between a microcontroller and at least one sensor chip according to one example implementation.

After all of the sensor chips have been allocated an address using the method, digital data can be interchanged between the microcontroller 230 and the sensor chips 210 via the digital single-master multi-slave bus line (digital signal interface 250) in parallel with the analog measurement signals. In this regard, FIG. 5 shows a schematic communication method 500 between the microcontroller 230 and at least one sensor chip 210.

The method 500 comprises conveying 502 analog measurement data between the sensor chip 210 and the microcontroller 230 via at least one analog signal interface 212 and, in parallel therewith, conveying 504 digital secondary information between the sensor chip 210 and the microcontroller 230 via the bidirectional digital signal interface 250.

The essence of example implementations of the present disclosure is to continue to use an analog signal path for the wideband realtime current information, but to introduce a digital interface that allows control and diagnosis of both the current sensor and the system to which the current sensor is connected. The bus capability of the proposed digital interface allows the additional complexity and number of wires (single wire!) to be reduced to an absolute minimum. The proposed digital interface allows simple and inexpensive sensor systems having high safety and availability demands and reduces the complexity of the end-of-line calibration.

The aspects and features that have been described together with one or more of the examples and figures detailed above can also be combined with one or more of the other examples in order to replace an identical feature of the other example or in order to introduce the feature into the other example additionally.

Examples can furthermore be or relate to a computer program having a program code for carrying out one or more of the methods above when the computer program is executed on a computer or processor. Steps, operations or processes of different methods described above can be carried out by programmed computers or processors.

Examples can also cover program storage apparatuses, e.g. digital data storage media, which are machine-, processor- or computer-readable and code machine-executable, processor-executable or computer-executable programs of instructions. The instructions carry out some or all of the steps of the methods described above or cause them to be carried out. The program storage apparatuses can comprise or be e.g. digital memories, magnetic storage media such as, for example, magnetic disks and magnetic tapes, hard disk drives or optically readable digital data storage media. Further examples can also cover computers, processors or control units programmed to carry out the steps of the methods described above, or (field) programmable logic arrays ((F)PLAs) or (field) programmable gate arrays ((F) PGAs) programmed to carry out the steps of the methods described above.

The description and drawings present only the principles of the disclosure. Furthermore, all examples mentioned here are intended to be used expressly only for illustrative purposes, in principle, in order to assist the reader in understanding the principles of the disclosure and the concepts contributed by the inventor(s) for further development of the art. All statements herein regarding principles, aspects and examples of the disclosure and also concrete examples thereof encompass the counterparts thereof.

A function block designated as "means for . . . " carrying out a specific function can relate to a circuit designed for carrying out a specific function. Consequently, a "means for something" can be implemented as a "means designed for or suitable for something", e.g. a component or a circuit designed for or suitable for the respective task.

Functions of different elements shown in the figures, including any function blocks referred to as "means", "means for providing a signal", "means for generating a signal", etc., can be implemented in the form of dedicated hardware, e.g. "a signal provider", "a signal processing unit", "a processor", "a controller", etc., and as hardware capable of executing software in conjunction with associated software. When provided by a processor, the functions can be provided by a single dedicated processor, by a single jointly used processor or by a plurality of individual processors, some or all of which can be used jointly. However, the term "processor" or "controller" is far from being limited to hardware capable exclusively of executing software, but rather can encompass digital signal processor hardware (DSP hardware), network processor, application specific integrated circuit (ASIC), field programmable logic array (FPGA=Field Programmable Gate Array), read only memory (ROM) for storing software, random access memory (RAM) and nonvolatile memory apparatus (storage). Other hardware, conventional and/or customized, can also be included.

A block diagram can depict for example a rough circuit diagram implementing the principles of the disclosure. In a similar manner, a flow diagram, a flowchart, a state transition diagram, a pseudo-code and the like can represent various processes, operations or steps represented for example substantially in a computer-readable medium and thus carried out by a computer or processor, regardless of whether such a computer or processor is explicitly shown. Methods disclosed in the description or in the patent claims can be implemented by a component having a means for carrying out each of the respective steps of the methods.

It goes without saying that the disclosure of multiple steps, processes, operations or functions disclosed in the description or the claims should not be interpreted as being in the specific order, unless explicitly or implicitly indicated otherwise, e.g. for technical reasons. The disclosure of multiple steps or functions thus does not limit them to a specific order, unless the steps or functions are not interchangeable for technical reasons. Furthermore, in some examples, an individual step, function, process or operation can include multiple substeps, subfunctions, subprocesses or suboperations and/or be subdivided into them. Such substeps may be included and be part of the disclosure of the individual step, provided that they are not explicitly excluded.

Furthermore, the claims that follow are hereby incorporated in the detailed description, where each claim may stand alone as a separate example. While each claim may stand alone as a separate example, it should be taken into consideration that—although a dependent claim can refer in the claims to a specific combination with one or more other claims—other examples can also encompass a combination of the dependent claim with the subject matter of any other dependent or independent claim. Such combinations are explicitly proposed here, provided that no indication is given that a specific combination is not intended. Furthermore, features of a claim are also intended to be included for any other independent claim, even if this claim is not made directly dependent on the independent claim.

The invention claimed is:

1. A sensor system, comprising:
   a microcontroller comprising:
     a first analog signal interface, and
     a first bidirectional digital signal interface; and
   at least three sensor chips, each sensor chip of the at least three sensor chips being configured to measure a physical quantity and comprising:
     a second analog signal interface, and
     a second bidirectional digital signal interface;
   wherein the microcontroller and each sensor chip of the at least three sensor chips are coupled to one another via the first analog signal interface and the second analog signal interface and via the first bidirectional digital signal interface and the second bidirectional digital signal interface,
   wherein the microcontroller and each sensor chip of the at least three sensor chips are coupled to one another via the first analog signal interface and the second analog signal interface to enable analog measurement data to be transmitted from each sensor chip of the at least three sensor chips and received by the microcontroller via an analog communication path, and
   wherein the microcontroller and each sensor chip of the at least three sensor chips are coupled to one another via the first bidirectional digital signal interface and the second bidirectional digital signal interface to enable digital secondary information to be transmitted between each sensor chip of the at least three sensor chips and the microcontroller via a digital communication path.

2. The sensor system as claimed in claim 1, wherein the microcontroller and each sensor chip of the at least three sensor chips are coupled to one another in parallel via the analog communication path and the digital communication path to convey analog and digital signals between each sensor chip of the at least three sensor chips and the microcontroller in parallel.

3. The sensor system as claimed in claim 1, wherein a sensor chip of the at least three sensor chips comprises a magnetic sensor.

4. The sensor system as claimed in claim 1, wherein the digital communication path is configured to convey at least one of a digital configuration, calibration data, or digital measurement data between the microcontroller and each sensor chip of the at least three sensor chips.

5. The sensor system as claimed in claim 4, wherein the microcontroller comprises a nonvolatile memory for at least one of the digital configuration or the calibration data, and wherein the microcontroller is configured to send the at least one of the digital configuration or the calibration data to each sensor chip of the at least three sensor chips when each sensor chip of the at least three sensor chips is started up.

6. The sensor system as claimed in claim 1, wherein the microcontroller is configured to use the digital communication path to dynamically vary operating parameters of each sensor chip of the at least three sensor chips.

7. The sensor system as claimed in claim 1, wherein each sensor chip of the at least three sensor chips is configured to use the digital communication path to provide the microcontroller with diagnosis data.

8. The sensor system as claimed in claim 1, wherein the microcontroller is configured to use the digital communication path to communicate predefined test sequences to each sensor chip of the at least three sensor chips.

9. The sensor system as claimed in claim 1, wherein the first bidirectional digital signal interface is in a form of a bidirectional 1-line interface.

10. The sensor system as claimed in claim 1, wherein the first bidirectional digital signal interface is in a form of a single-master multi-slave bus system.

11. The sensor system as claimed in claim 1, wherein the microcontroller is configured to set a variable data rate for the first bidirectional digital signal interface from a predefined range.

12. The sensor system as claimed in claim 1, comprising
a plurality of n sensor chips interfaced with the microcontroller via the first bidirectional digital signal interface,
wherein n is greater than three,
wherein the microcontroller is designed to use the first bidirectional digital signal interface to provide an addressing command to at least n−1 of the plurality of n sensor chips,
wherein each of the at least n−1 of the plurality of n sensor chips is configured to respond to the addressing command by using a respective analog signal interface or a respective bidirectional digital signal interface to convey a random output signal to the microcontroller, and
wherein each of the at least n−1 of the plurality of n sensor chips is configured to receive a unique address in response to a respective random output signal.

13. The sensor system as claimed in claim 12, wherein the microcontroller is configured to use the first bidirectional digital signal interface to allocate each of the at least n−1 of the plurality of n sensor chips the unique address.

14. A method for communication between a microcontroller and at least three sensor chips, each sensor chip of the at least three sensor chips being configured to measure a physical quantity, the method comprising:
conveying, via an analog communication path, analog measurement data from each of the at least three sensor chips and to the microcontroller via a first analog signal interface of the microcontroller and a second analog signal interface of each of the at least three sensor chips; and
conveying, via a digital communication path, digital secondary information between each of the at least three sensor chips and the microcontroller via a first bidirectional digital signal interface of the microcontroller and a second bidirectional digital signal interface of each of the at least three sensor chips, wherein the digital communication path enables the digital secondary information to be conveyed in parallel with the analog measurement data conveyed via the analog communication path.

15. A sensor chip, comprising:
at least three sensor circuits, each sensor circuit of the at least three sensor circuits being configured to respond to a physical quantity to be measured by providing an analog measurement signal;
each sensor circuit comprising:
at least one first analog signal interface configured to convey, via an analog communication path, the analog measurement signal from the sensor chip to a second analog signal interface of a microcontroller; and
at least one first bidirectional digital signal interface configured to convey digital secondary information between the sensor chip and a second bidirectional digital signal interface of the microcontroller.

16. The sensor chip as claimed in claim 15, wherein a sensor circuit of the at least three sensor circuits comprises a current sensor circuit.

17. The sensor chip as claimed in claim 15, wherein the at least one first analog signal interface and the at least one first bidirectional digital signal interface of each sensor circuit are configured to transmit signals in parallel.

18. The sensor chip as claimed in claim 15, wherein the sensor chip is configured to use the at least one first bidirectional digital signal interface of each sensor circuit to provide the microcontroller with diagnosis data.

19. The sensor chip as claimed in claim 15, wherein the sensor chip is configured to use the at least one first bidirectional digital signal interface of each sensor circuit to receive at least one of configuration data or calibration data from the microcontroller and to set operating parameters of each sensor chip based on the at least one of the configuration data or the calibration data.

* * * * *